US012696398B2

(12) United States Patent
Beaupré-Laflamme et al.

(10) Patent No.: US 12,696,398 B2
(45) Date of Patent: Jul. 28, 2026

(54) METHOD FOR PLACING A CHIP FOR DEVICE MANUFACTURING

(71) Applicant: Ciena Corporation, Hanover, MD (US)

(72) Inventors: Raphael Beaupré-Laflamme, Quebec (CA); Simon Savard, Quebec (CA); Jean-Sébastien Côté, Québec (CA)

(73) Assignee: Ciena Corporation, Hanover, MD (US)

( * ) Notice: Subject to any disclaimer, the term of this patent is extended or adjusted under 35 U.S.C. 154(b) by 603 days.

(21) Appl. No.: 18/194,674

(22) Filed: Apr. 3, 2023

(65) Prior Publication Data

US 2024/0326252 A1     Oct. 3, 2024

(51) Int. Cl.
| | |
|---|---|
| *H05K 3/303* | (2026.01) |
| *B25J 9/16* | (2006.01) |
| *H05K 13/04* | (2006.01) |
| *B25J 13/08* | (2006.01) |
| *B25J 17/02* | (2006.01) |

(52) U.S. Cl.
CPC ............ *H05K 3/305* (2013.01); *B25J 9/1687* (2013.01); *H05K 13/0409* (2018.08); *B25J 13/088* (2013.01); *B25J 17/0225* (2013.01); *Y10T 29/49133* (2015.01)

(58) Field of Classification Search
CPC .... B25J 9/1687; B25J 13/088; B25J 17/0225; H05K 13/0409; H05K 3/305; Y10T 29/49133
See application file for complete search history.

(56) References Cited

U.S. PATENT DOCUMENTS

| | | | | |
|---|---|---|---|---|
| 6,016,949 A | * | 1/2000 | Slesinger | ........... H05K 13/0409 228/232 |
| 2006/0053624 A1 | * | 3/2006 | Maeda | ............... H05K 13/0409 29/832 |

FOREIGN PATENT DOCUMENTS

JP        2018032808 A   *  3/2018

OTHER PUBLICATIONS

Kerndl et al., "Conductive Printing of RFID Tag and Chip Contacting Methods for High vol. Additive Production", 2021 44th International Conference on Telecommunications and Signal Processing (TSP), Brno, Czech Republic, 2021, pp. 352-356. (Year: 2021).*

(Continued)

*Primary Examiner* — A. Dexter Tugbang
(74) *Attorney, Agent, or Firm* — Young Basile Hanlon & MacFarlane, P.C.

(57)        ABSTRACT
In one aspect, in general, a method for placing a chip for device manufacturing comprises: picking up the chip with a component placement tool comprises a tool surface; spatially translating the component placement tool and the chip along a direction substantially perpendicular to a plane defined by a reference surface, the spatially translating comprising beginning the spatially translating at a first spatial coordinate with respect to the direction, and ending the spatially translating when contact between the reference surface and the tool surface is detected by a sensor at a second spatial coordinate with respect to the direction; and in response to detecting the contact, releasing the chip from the component placement tool and onto a portion of a device assembly in proximity to the second spatial coordinate with respect to the direction.

19 Claims, 19 Drawing Sheets

(56)            References Cited

OTHER PUBLICATIONS

Wozniak et al., "Setup for Triggering Force Testing of Touch Probes for CNC Machine Tools and CMMs" Measurement Science Review, vol. 13, No. 1, Feb. 2013, https://doi.org/10.2478/msr-2013-0004.

* cited by examiner

METHOD FOR PLACING A CHIP FOR DEVICE MANUFACTURING

TECHNICAL FIELD

This disclosure relates to managing component placement in device assembly.

BACKGROUND

Devices that incorporate two or more distinct chips or packages providing optical and/or electrical functionalities continue to play a role in a wide range of applications. However, there is often a gap between component design and the assembly process. In such electronic, opto-electronic, and opto-mechanical component assembly processes, part placement tolerancing may be critical for a variety of reasons. Furthermore, accurate part placement of various types of components in the assembly of devices may be desired.

SUMMARY

In one aspect, in general, a method for placing a chip for device manufacturing comprises: picking up the chip with a component placement tool comprising a tool surface; spatially translating the component placement tool and the chip along a direction substantially perpendicular to a plane defined by a reference surface, the spatially translating comprising beginning the spatially translating at a first spatial coordinate with respect to the direction, and ending the spatially translating when contact between the reference surface and the tool surface is detected by a sensor at a second spatial coordinate with respect to the direction; and in response to detecting the contact, releasing the chip from the component placement tool and onto a portion of a device assembly in proximity to the second spatial coordinate with respect to the direction.

Aspects can include one or more of the following features.

The portion of the device assembly onto which the chip is released comprises adhesive.

The adhesive is thermally conductive and located on top of a temperature control module.

The adhesive has a non-uniform thickness.

The spatially translating further comprises spatially translating the component placement tool along a direction substantially parallel to the plane defined by the reference surface.

The sensor detects contact between the reference surface and the tool surface by at least one of (1) detecting a change in mechanical force, (2) detecting a change in air pressure in a portion of the component placement tool, or (3) detecting a change in an electrical connection caused by the contact between the reference surface and the tool surface.

In another aspect, in general, a component placement tool for placing a chip for device manufacturing, the component placement tool comprising: a movable portion comprising a component manipulation portion configured to pick up the chip and to release the chip, and a detection portion configured to detect contact between a tool surface and a reference surface; and a control module configured to spatially translate the movable portion along a direction substantially perpendicular to a plane defined by the reference surface, the spatially translating comprising beginning the spatially translating at a first spatial coordinate with respect to the direction, and ending the spatially translating when contact between the tool surface and the reference surface is detected by the detection portion at a second spatial coordinate with respect to the direction; and release the chip from the component manipulation portion and onto a portion of a device assembly in proximity to the second spatial coordinate with respect to the direction, in response to detecting the contact.

Aspects can include one or more of the following features.

The chip comprises a plurality of electrical or optical connections.

The component manipulation portion and the detection portion define respective planes that are substantially the same.

The component manipulation portion and the detection portion define respective planes that are offset from one another along the direction substantially perpendicular to the plane defined by the reference surface.

The component manipulation portion configured to pick up the chip and to release the chip comprises at least one of (1) a negative pressure portion configured to secure the chip using suction, or (2) a gripping portion configured to secure the chip using mechanical contact.

The reference surface is rigid.

In another aspect, in general, a method for placing a chip for device manufacturing comprises: determining a first spatial coordinate with respect to a direction substantially perpendicular to a plane defined by a reference surface; determining a tolerance range of the first spatial coordinate; determining a second spatial coordinate with respect to the direction, based at least in part on the first spatial coordinate and the tolerance range; determining a travel distance between the second spatial coordinate and a third spatial coordinate with respect to the direction; picking up the chip with a component placement tool comprises a tool surface and a compressible tool component; spatially translating the component placement tool along the direction, the spatially translating comprising beginning the spatially translating at the third spatial coordinate; spatially translating the chip to a spatial coordinate at which the tool surface contacts the reference surface; pressing the tool surface against the reference surface, thereby compressing the compressible tool component by a compression distance without further spatial translation of the chip; and ending the spatially translating of the component placement tool when a sum of a distance traveled by the chip during the spatially translating and the compression distance is substantially equal to the determined travel distance; releasing the chip from the component placement tool and onto a portion of a device assembly in proximity to the first spatial coordinate with respect to the direction.

Aspects can include one or more of the following features.

The compressible tool component comprises one or more springs.

The compression distance is greater than 5 microns and less than 500 microns.

The method further comprises picking up a second chip with the component placement tool, prior to spatially translating the component placement tool.

The reference surface is a top surface of a second chip.

The method further comprises forming electrical and/or optical connections between the second chip and the chip.

The connections include at least one free-space optical connection.

The connections include at least one electrical connection that is formed by wire bonding and transmits signals that include radio frequencies.

Aspects can have one or more of the following advantages.

The component placement tool described herein may allow for increased accuracy in achieving prescribed adhesive bond line thicknesses. Achieving adhesive bond line thicknesses closer to the intended design and specification may allow for enhanced thermal performance. For example, if a particular adhesive bond line thickness is desired (e.g., for making a device substantially athermal or less prone to misalignment of components while undergoing thermal expansion or contraction), by placing a chip at a more accurate height on top of the adhesive bond line, the final height of the bond line may be better controlled.

Furthermore, the component placement tool may allow for increased accuracy in chip placement (e.g., by reducing chip interface placement tolerancing along one, two, or three coordinate axes), thus allowing for improvements in wire bonding (e.g., reducing the length of wire bonds between the placed chip and another chip on the device) and a possibly simpler and more accurate prescribed assembly sequence (e.g., ensuring that wire bonds are located on the same surface notwithstanding the assembly). By creating wire bonds or shorter and more consistent lengths, devices may achieve increased radio frequency (RF) performance (e.g., less power losses). By increasing the accuracy of the prescribed assembly sequence, shorter assembly times may be possible since the assembly sequence may have less variation and wire bonds may be performed in the same directions with higher consistency. Correspondingly, the component placement tool described herein may enable simpler and/or less expensive assembly machines.

Other features and advantages will become apparent from the following description, and from the figures and claims.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Some assembly machines can make a reference (e.g., optically, or by a mechanical part touching down on a surface) and then move to a prescribed location using information about the reference. Such capabilities however, may not be readily available on die bonding machines. Furthermore, such assembly machines may require complicated assembly sequences (e.g., extra steps to perform adhesive dispense), possibly limiting throughput of device production.

The example pick-up tools (also referred to as component placement tools) and associated assembly processes described herein may increase part placement accuracy and enable the assembly of devices that more closely adhere to design intention. The pick-up tools described herein may comprise a detection portion or a tool surface that may come into mechanical contact with a reference surface or plane. By incorporating such a detection portion or tool surface, the pick-up tool may place a chip with high accuracy at a location or plane relative to the reference plane. Thus, a device may be assembled with a number of components all located relative to one another with high accuracy, even if the components and adhesive under each component form a nonuniform or varying stack-up (e.g., the underlying adhesive bond line thicknesses differ, or underlying components are placed at an angle with respect to a vertical plane, or the thicknesses of the underlying components themselves vary across devices).

Figure 1A:
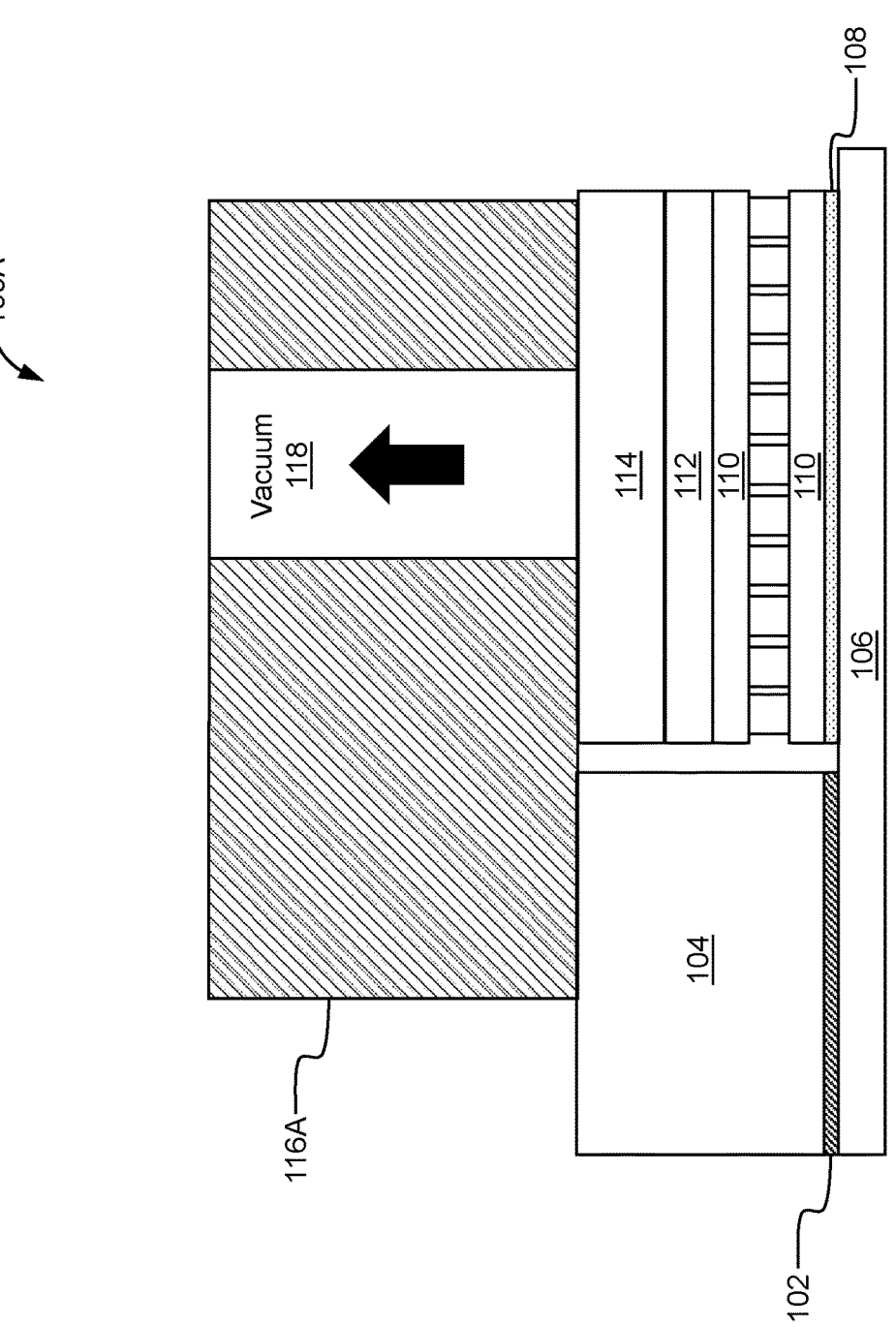
FIG. 1A is a schematic diagram of an example device during assembly.

FIG. 1A shows a schematic diagram of an example device under assembly 100A. A first adhesive 102 is located between a reference package 104 and a wafer 106. The reference package 104 can be, for example, a block of rigid material (e.g., metal or hard plastic) or any other structure that provides a relatively flat reference surface that is strong enough to withstand any pressure exerted on it during assembly. A second adhesive 108 is located between a TEC 110 (thermo-electric cooler) and the wafer 106. A third adhesive 112 is located between the TEC 110 and a chip 114. A pick-up tool 116A uses a vacuum channel 118 (i.e., negative pressure) to pick up and hold the chip 114. The pick-up tool may be part of a larger assembly machine used in the assembly of the chip 114. For example, the larger assembly machine could translate the pick-up tool 116A in one, two, or three dimensions to assist with the assembly of the chip 114. In some examples (e.g., high powered multi-IC chip devices), it can be desirable to control the operating temperature of certain components via a cooling system (e.g., thermo-electric coolers (TECs) and/or passive heatsinks). In the example device under assembly 100A, the chip 114 is adhered to the TEC 110 using the third adhesive 112. The third adhesive may be thermally conductive (e.g., having a relatively high thermal conductivity) to assist with heat conduction from the chip 114 to the TEC 110. In other examples, the TEC 110 may be replaced with a different element (e.g., an electrical or photonic chip), or may altogether be absent. Both the reference package 104 and the chip 114 can include electrical and photonic integrated circuits. The bottom surface of the pick-up tool 116A is flat, such that the top surface of the reference package 104 and the top surface of the chip 114 are in the same plane. By using a portion of the pick-up tool 116A itself to reference the top plane of the reference package 104 directly, the chip 114 can be placed in a plane parallel to the top plane of the reference package 104. Furthermore, the impact of the underlying stack-up can be reduced, since the top plane of the reference package 104 substantially determines the placement of the chip 114. For example, the placement of the chip 114 may be substantially less dependent on the underlying stack-up (e.g., the second adhesive 108, the third adhesive 112, and the TEC 110) than pick-up tools that do not reference the reference package 104. Accordingly, the effect of bond line thicknesses and the angles at which components are placed can be reduced when using the pick-up tool 116A.

Figure 1B:
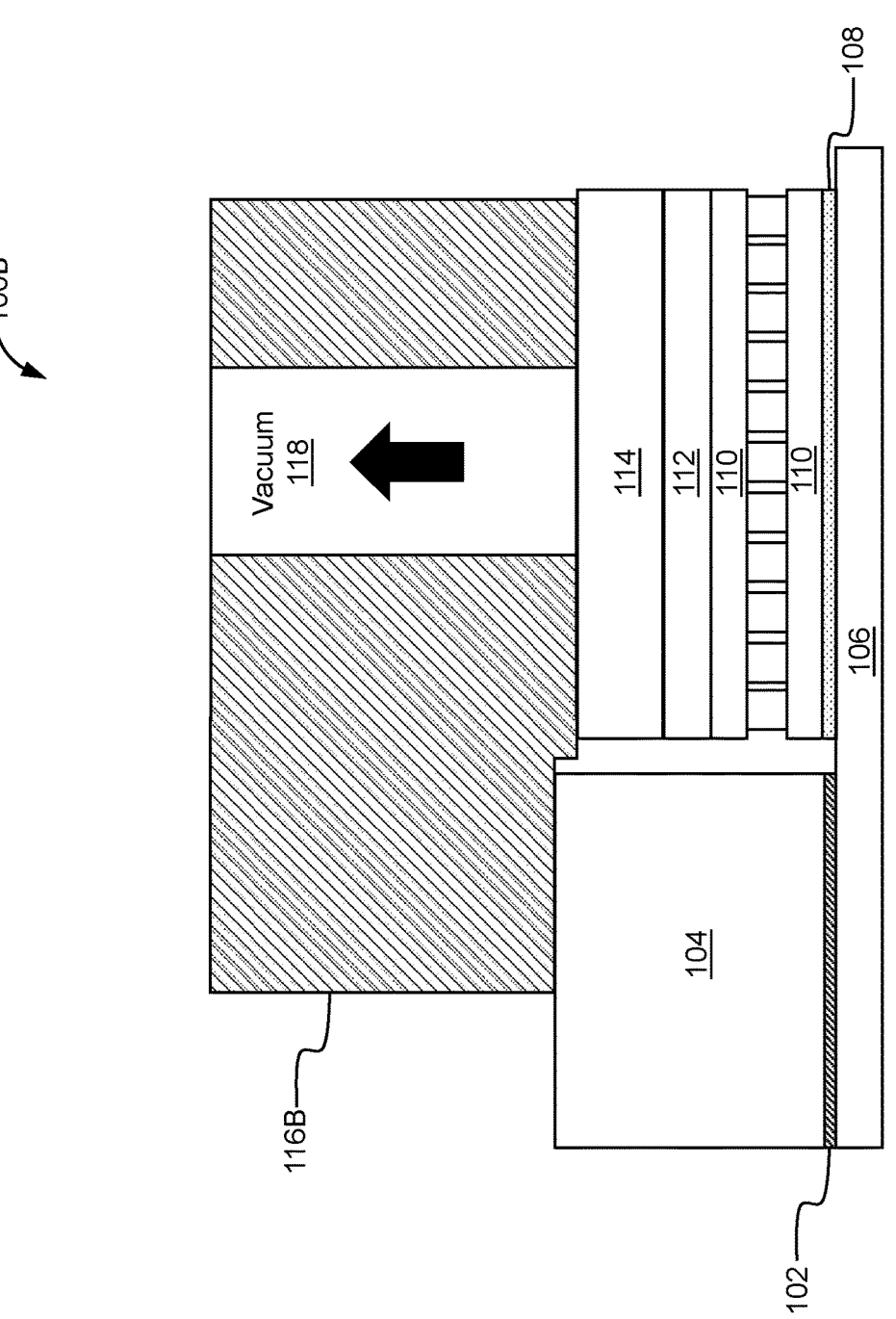
FIG. 1B is a schematic diagram of an example device during assembly.

FIG. 1B shows a schematic diagram of an example device under assembly 100B. A pick-up tool 116B comprises a bottom portion comprising two surfaces vertically offset from one another. The vertical offset between the two surfaces of the bottom portion of the pick-up tool 116B allow for placement of a chip 114 such that its top surface is not in the same plane as the top surface of a reference package 104.

Figure 1C:
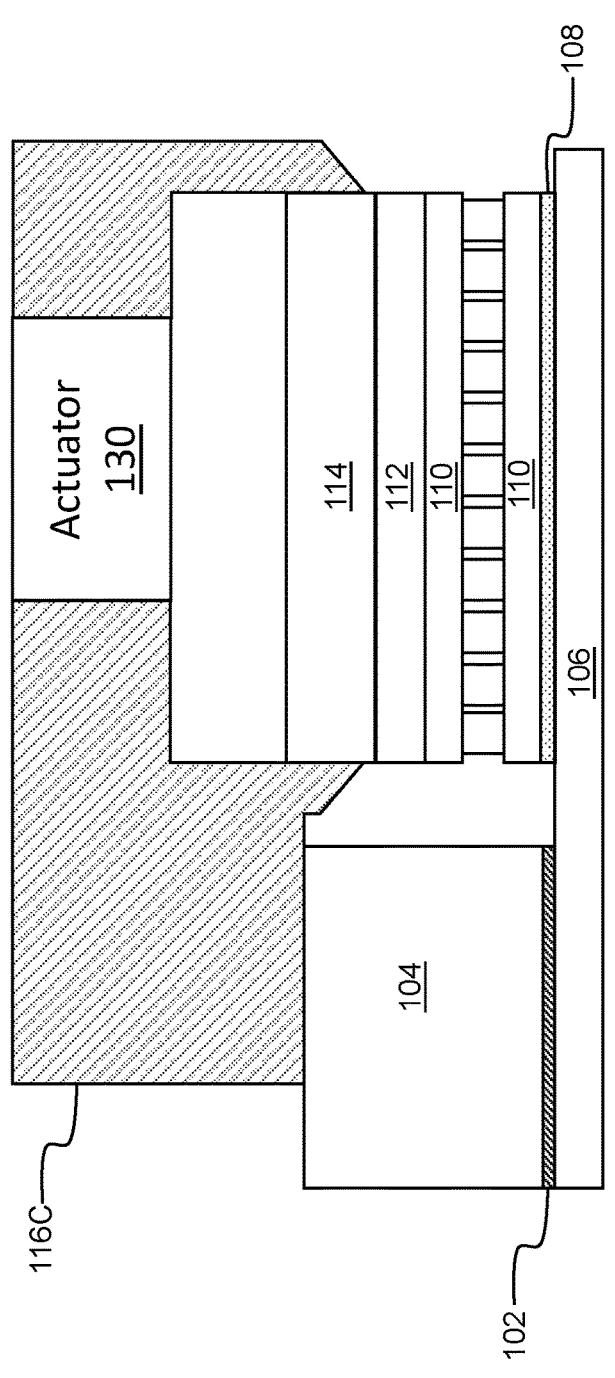
FIG. 1C is a schematic diagram of an example device during assembly.

Picking up chips with a pick-up tool may be accomplished through various means. The pick-up tool described herein can additionally perform chip pick up through means other than the use of vacuum suction. For example, chips may be picked up using an activated gripper, as shown in FIG. 1C. The gripper may be activated through various means (e.g., piezo-electric effect).

FIG. 1C shows a schematic diagram of an example device under assembly 100C. A pick-up tool 116C comprises a vice-like holder that can pick-up and release a chip 114 based on an actuator 130. For example, the actuator 130 can expand or contract the pick-up tool 116C to release or pick up the chip, respectively.

Figure 1D:
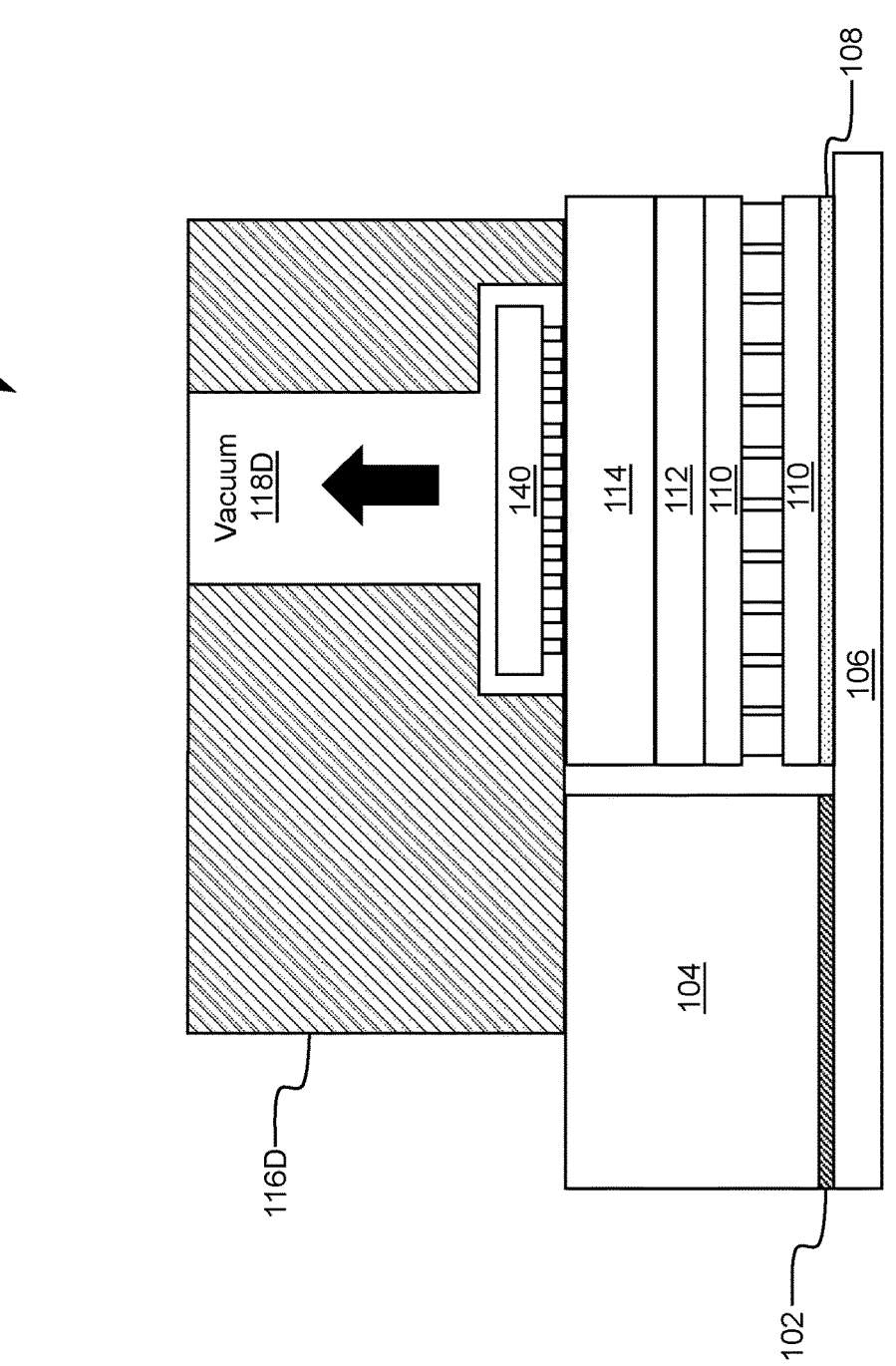
FIG. 1D is a schematic diagram of an example device during assembly.

FIG. 1D shows a schematic diagram of an example device under assembly 100D. A pick-up tool 116D comprises a vacuum channel 118D. The vacuum channel 118D can fit a portion or all of a companion chip 140, where the companion chip 140 is in the process of being placed on top of a chip 114. The vacuum channel 118D may allow for the companion chip to be placed on top of the chip 114 at a height determined by both the top surface of a reference package 104 and the shape of the vacuum channel 118D. For example, the companion chip 140 may be placed such that its bottom surface is aligned with the top surface of the reference package 104.

Figure 1E:
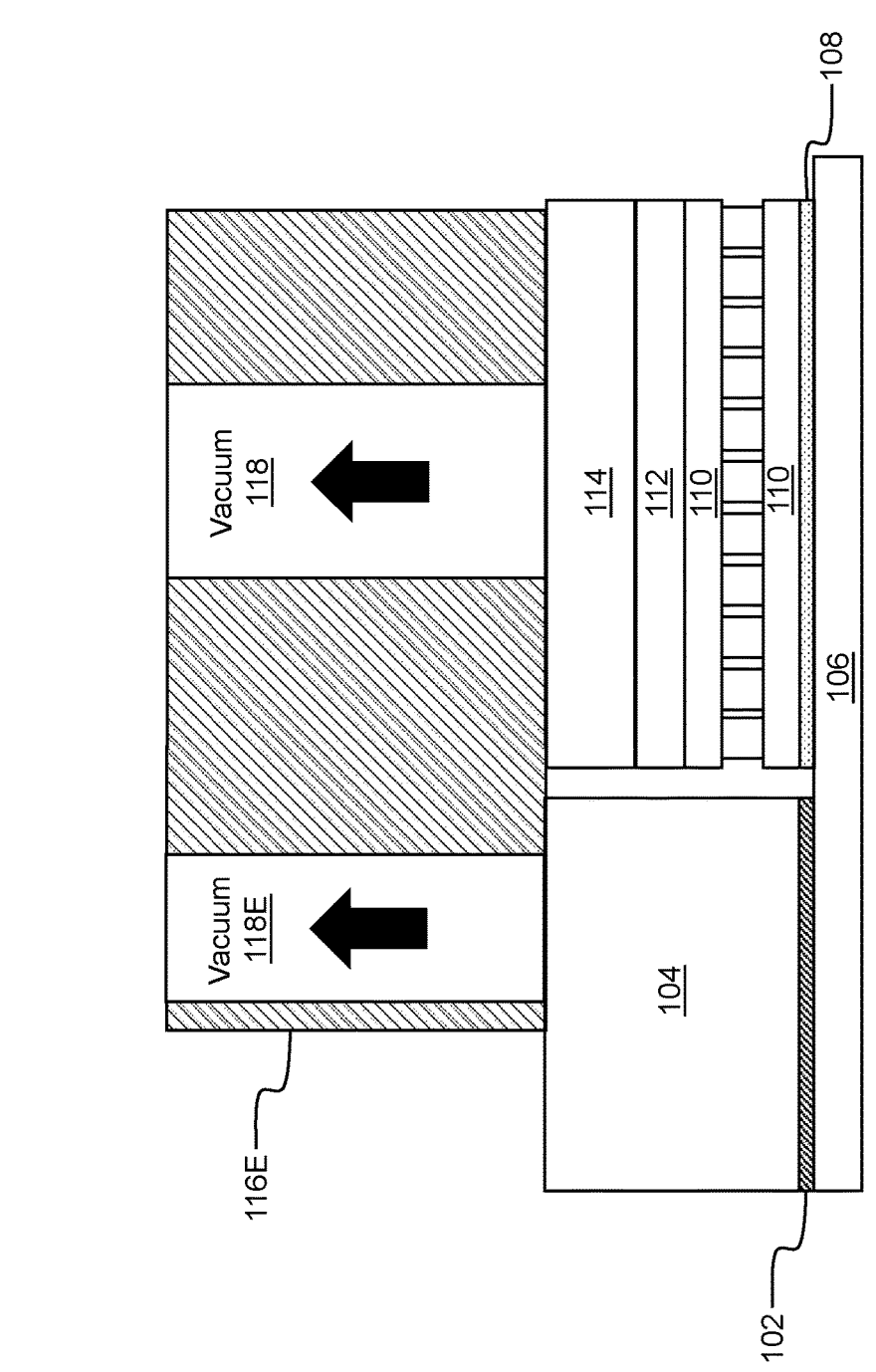
FIG. 1E is a schematic diagram of an example device during assembly.

FIG. 1E shows a schematic diagram of an example device under assembly 100E. A pick-up tool 116E comprises a vacuum channel 118 and a second vacuum channel 118E. The pick-up tool 116E may be used to place both a reference package 104 and a chip 114. For example, the vacuum channel 118 could pick up the chip 114, the pick-up tool 116E could then move above the reference package 104 and pick it up using the second vacuum channel 118E, and then the pick-up tool 116E could place both the chip 114 and the reference package 104 at the same time and release vacuum simultaneously. Thus, the pick-up tool 116E may be used to place two components with high accuracy of their relative positioning.

Figure 2A:
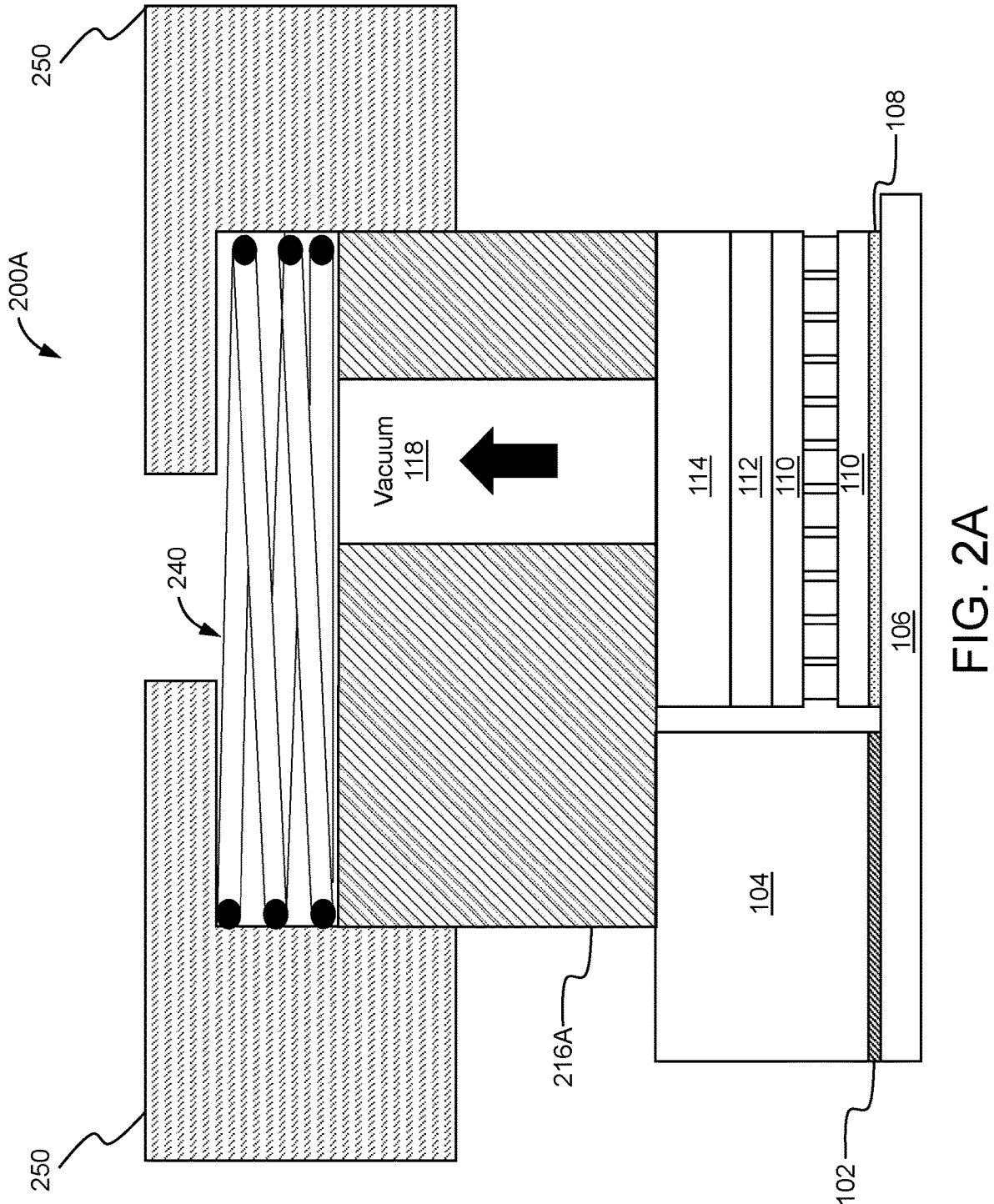
FIG. 2A is a schematic diagram of an example device during assembly.

FIG. 2A shows a schematic diagram of an example device under assembly 200A. A pick-up tool 216A comprises a compressible tool component 240 (e.g., a spring) and a holder 250 (e.g., a clamp). In some examples, the holder 250 may be part of or attached to a larger assembly that can be spatially translated. In such examples, the pick-up tool 216A may be a sub-component of the larger assembly. The compressible tool component 240 may be compressed when a chip 114 is in the process of being placed, since a bottom surface of the pick-up tool 216A may experience a normal force from a reference package 104 (e.g., when the pick-up tool 216A and the reference package 104 are in contact). By allowing for the compressible tool component 240 to compress, the pick-up tool 216A can compensate for tolerances in the assembly process. For example, if the vertical location accuracy of the pick-up tool 216A is known to be 10 microns, an overtravel of 100 microns lower than the approximate vertical location of the top surface of the reference package 104 can be designated when performing placement of the chip 114. In such an example, the pick-up tool 216A will be lowered until its bottom portion comes into contact with the top surface of the reference package 104. As the pick-up tool is lowered further, the compressible tool component 240 will compress while the bottom surface of the pick-up tool 216A remains immobile due to normal force from the reference package 104. Thus, the compressible tool component 240 allows for inaccuracies in exact location to be compensated for by compressing the compressible tool component 240 rather than continuing movement of the chip 114.

Figure 2B:
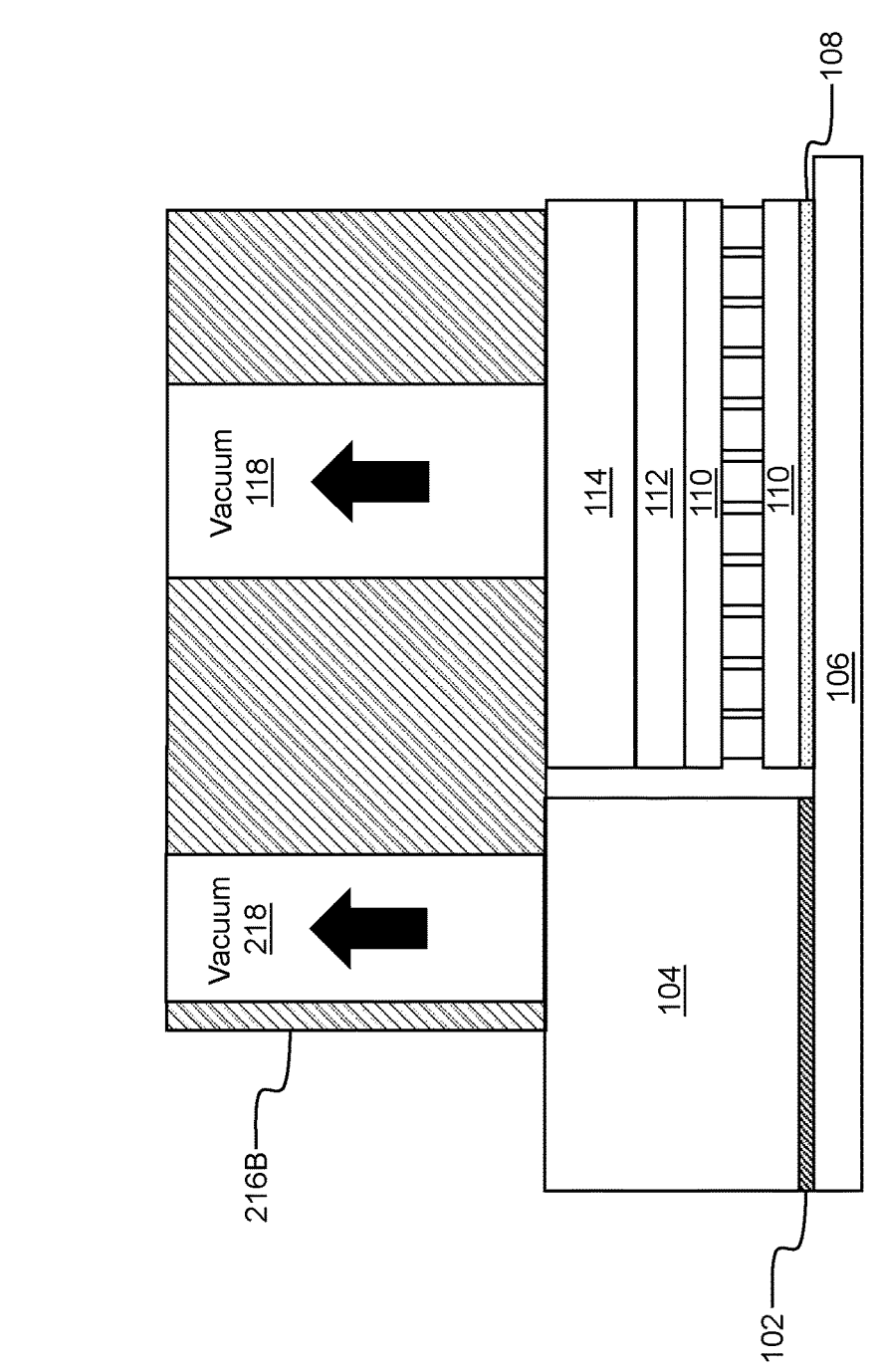
FIG. 2B is a schematic diagram of an example device during assembly.

FIG. 2B shows a schematic diagram of an example device under assembly 200A. A pick-up tool 216B comprises a vacuum channel 118 to pick up and release a chip 114, and a vacuum detection channel 218. The vacuum detection channel 218 senses contact of the bottom surface of the pick-up tool 216B with the top surface of a reference package 104 by sensing a change in pressure associated with the vacuum detection channel 218. For example, the vacuum detection channel 218 may have a first pressure when the bottom surface of the pick-up tool 216B is not in contact with the top surface of the reference package 104, and a second pressure when the two surfaces are in contact with each other. The change in pressure may be sensed by a pressure sensor (not shown), and the downward motion of the pick-up tool 216B can be stopped, and the chip 114 released, when a specified change in the pressure of the vacuum detection channel 218 is measured.

Figure 2C:
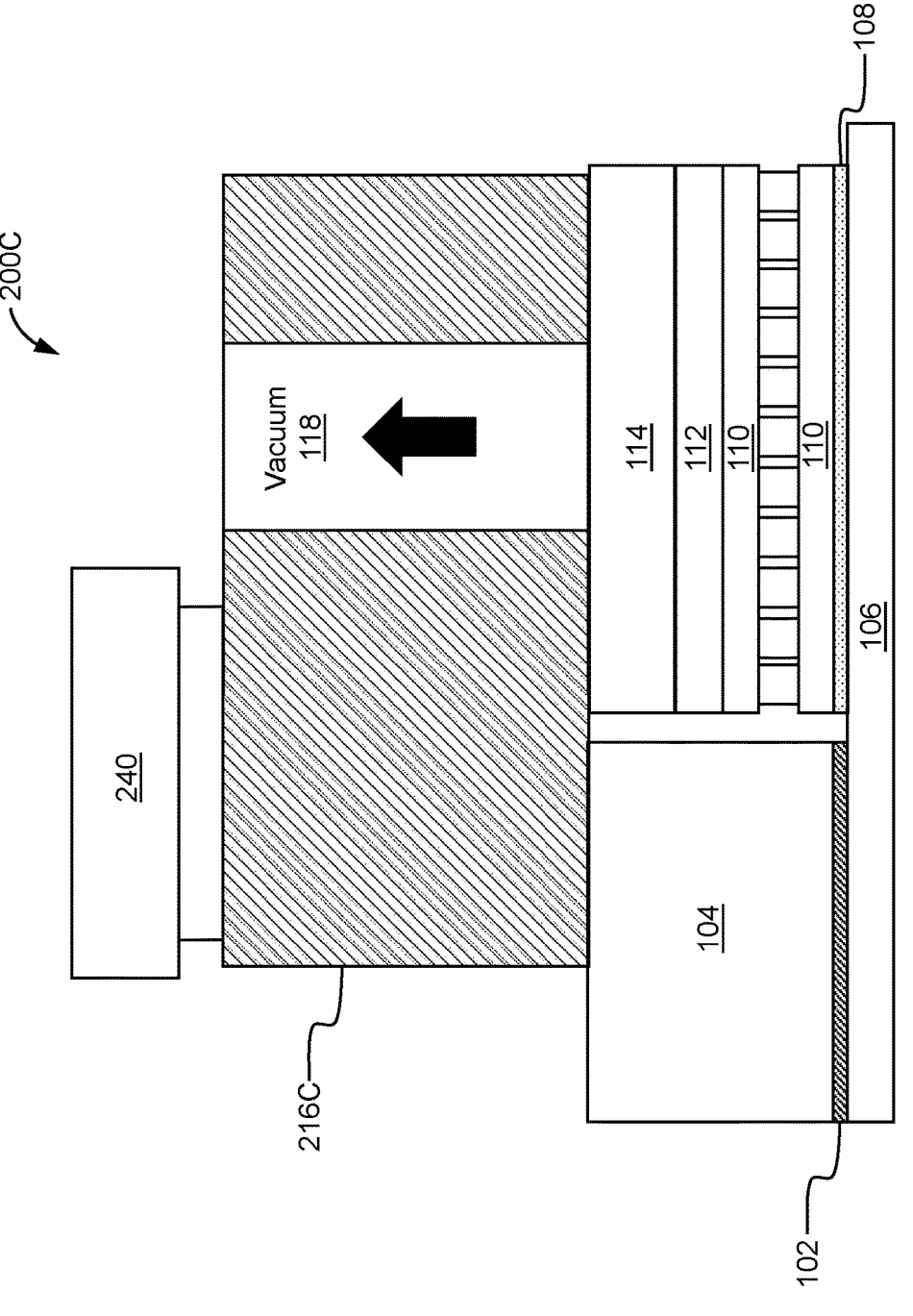
FIG. 2C is a schematic diagram of an example device during assembly.

FIG. 2C shows a schematic diagram of an example device under assembly 200C. A pick-up tool 216C comprises a force sensor 240. The force sensor 240 senses contact of the bottom surface of the pick-up tool 216C with the top surface of a reference package 104 by sensing a change in the normal force associated with the reference package 104. For example, the force sensor may record a first measured force value when the bottom surface of the pick-up tool 216C is not in contact with the top surface of the reference package 104, and a second measured force value when the two surfaces are in contact with each other. Once a specified change in force is detected, the downward motion of the pick-up tool 216C can be stopped, and the chip 114 released.

Figure 2D:
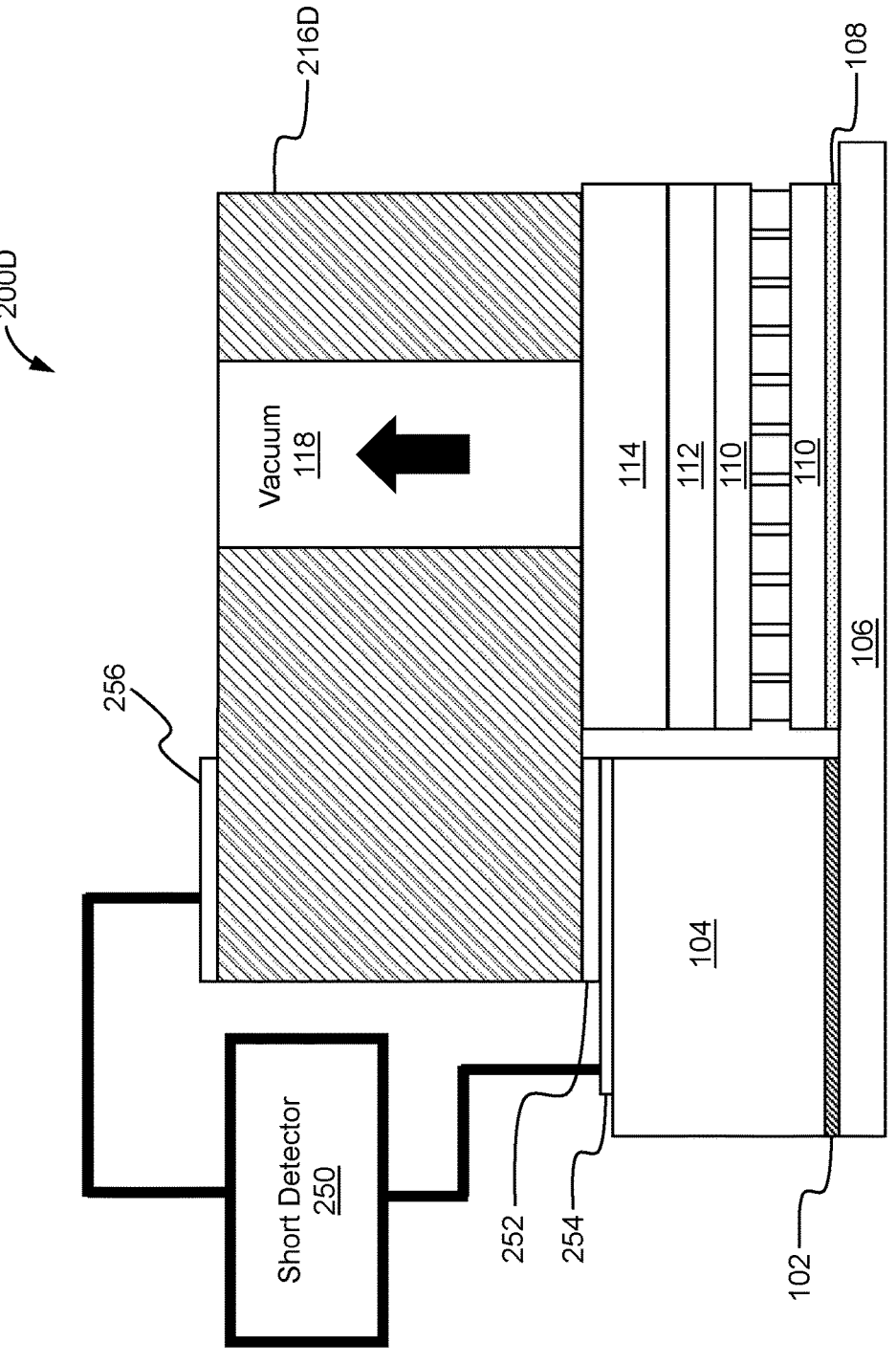
FIG. 2D is a schematic diagram of an example device during assembly.

FIG. 2D shows a schematic diagram of an example device under assembly 200D. A pick-up tool 216D comprises an electrical short sensor 250. The electrical short sensor 250 senses contact of the bottom surface of the pick-up tool 216D with the top surface of a reference package 104 by electrically shorting, via direct contact of a first electrically conductive element 252 attached to the bottom portion of the pick-up tool 216D with a second electrically conductive element 254 attached to the top portion of the reference package 104. The second electrically conductive element 254 is electrically connected to a third electrically conductive element 256, attached to the top portion of the pick-up tool 216D. For example, the electrical short detector 250 may detect that there is no electrical short present when the first electrically conductive element 252 is not in direct contact with the second electrically conductive element 254. Furthermore, the electrical short detector 250 may detect that there is an electrical short present when the first electrically conductive element 252 is in direct contact with the second electrically conductive element 254. Once an electrical short is detected by the electrical short detector 250, the downward motion of the pick-up tool 216D can be stopped, and the chip 114 released. A variety of other types of electrical sensors could be used that detect a change in an electrical connection caused by the contact between a surface of the reference package 104 and a surface of the pick-up tool 216D. The contact may cause a short circuit that drives an electrical current, or the contact may cause any other change in an electrical connection that can be sensed by a monitoring a current signal or a voltage signal in an associated electrical circuit. In some implementations, a sensor can include portions that are integrated with a portion of the pick-up tool, such as the vacuum detection channel 218, force sensor 240, or electrically conductive element 256. In other implementations, a sensor can be integrated into the reference package 104 or a base below the wafer 106 and communicatively coupled to a portion of the pick-up tool that controls movement without necessarily being integrated with the pick-up tool.

FIGS. 3A-F show an example assembly process for a device.

Figure 3A:
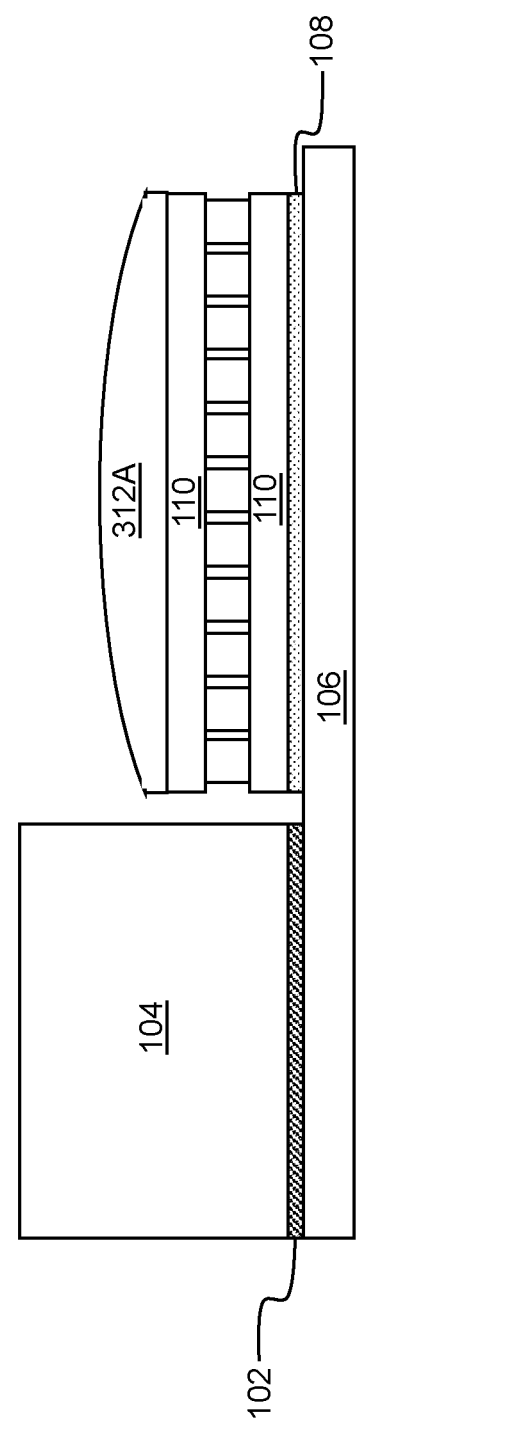
FIGS. 3A, 3B, 3C, 3D, 3E, and 3F are schematic diagrams of an example assembly process for a device.

FIG. 3A shows a schematic diagram of an example under-assembly device 300A with a pre-chip placement adhesive 312A located on top of a TEC 110.

Figure 3B:
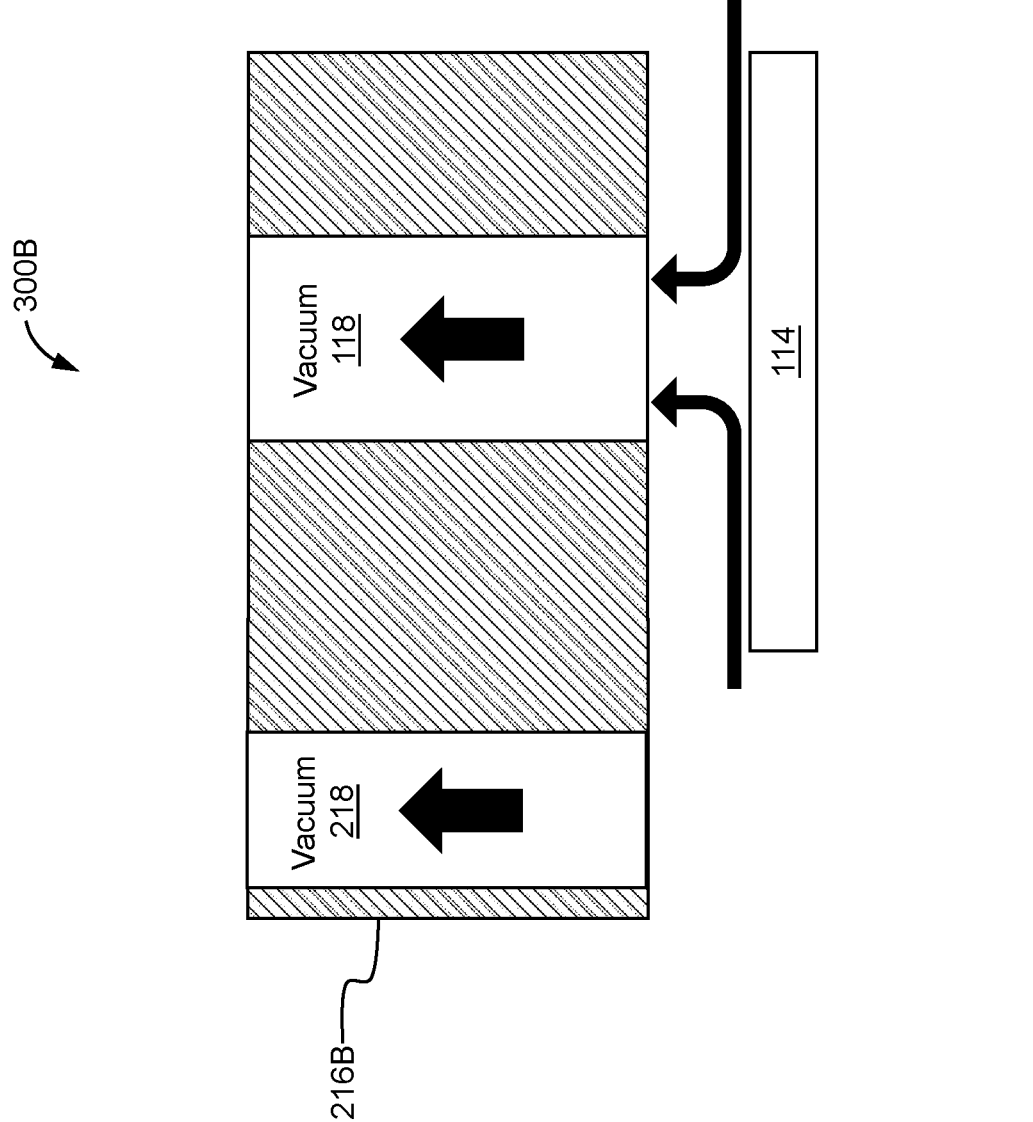

FIG. 3B shows a schematic diagram of an example pick-up process 300B comprising a pick-up tool 216B lifting a chip 114 using negative pressure provided by a vacuum channel 118. A vacuum detection channel 218 is used later in the process as an example of contact detection.

Figure 3C:
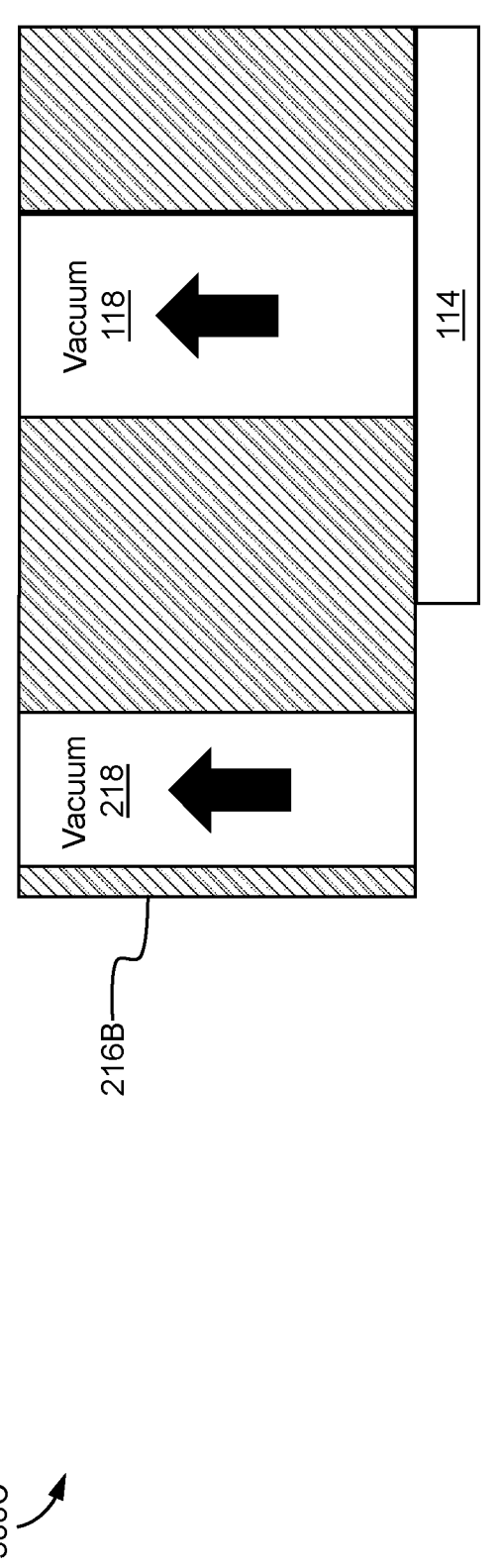
Figure 3C:
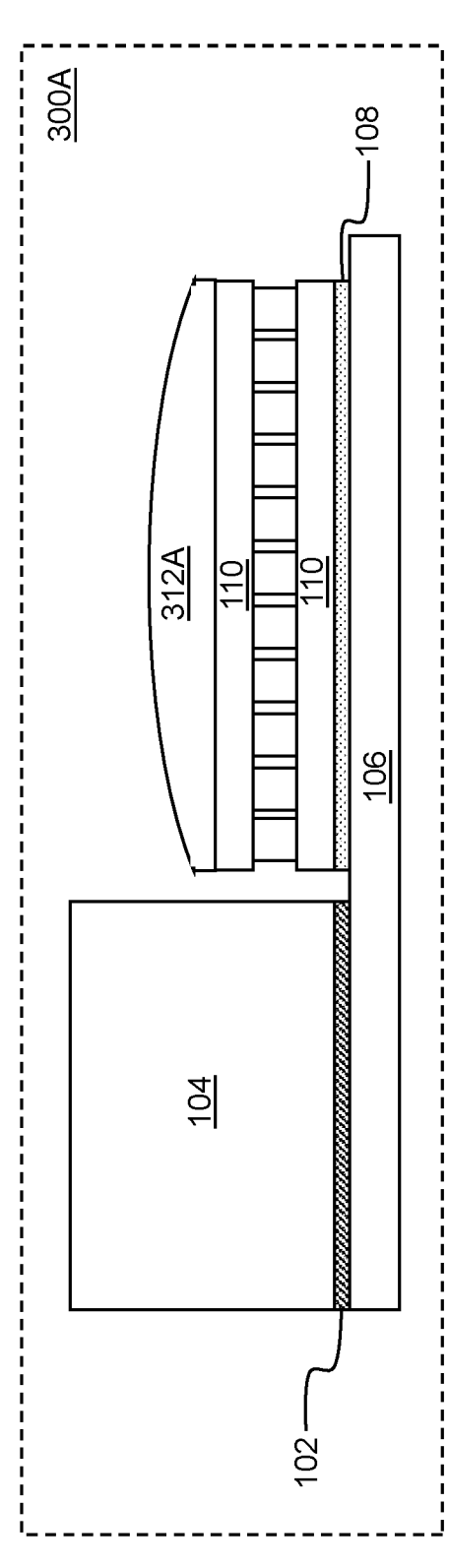

FIG. 3C shows a schematic diagram of an example assembly process for a device 300C. A pick-up tool 216B carrying a chip 114 traverses towards an under-assembly device 300A.

Figure 3D:
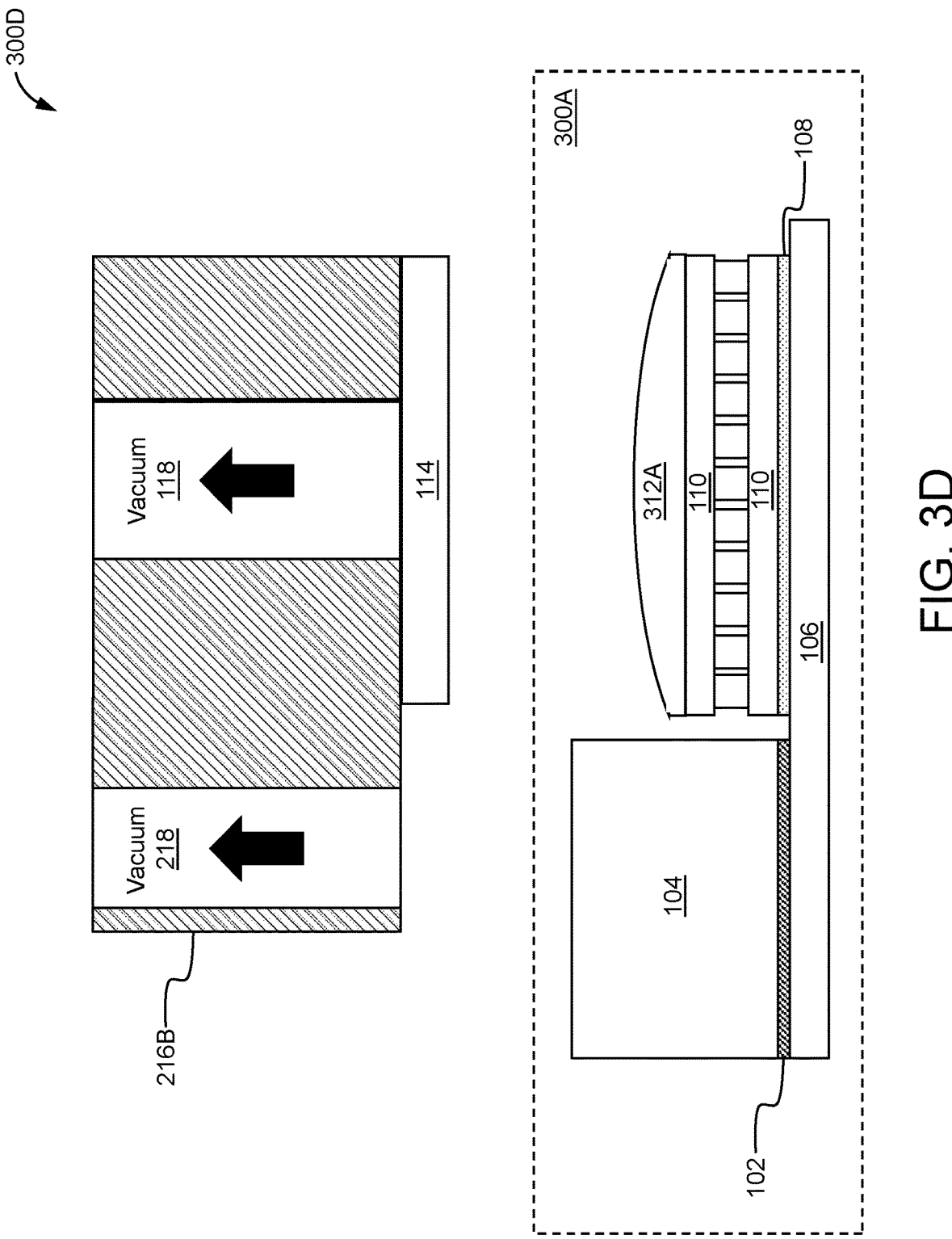

FIG. 3D shows a schematic diagram of an example assembly process for a device 300D. A pick-up tool 216B carrying a chip 114 traverses towards an under-assembly device 300A such that the chip 114 is vertically above a pre-chip placement adhesive 312A.

Figure 3E:
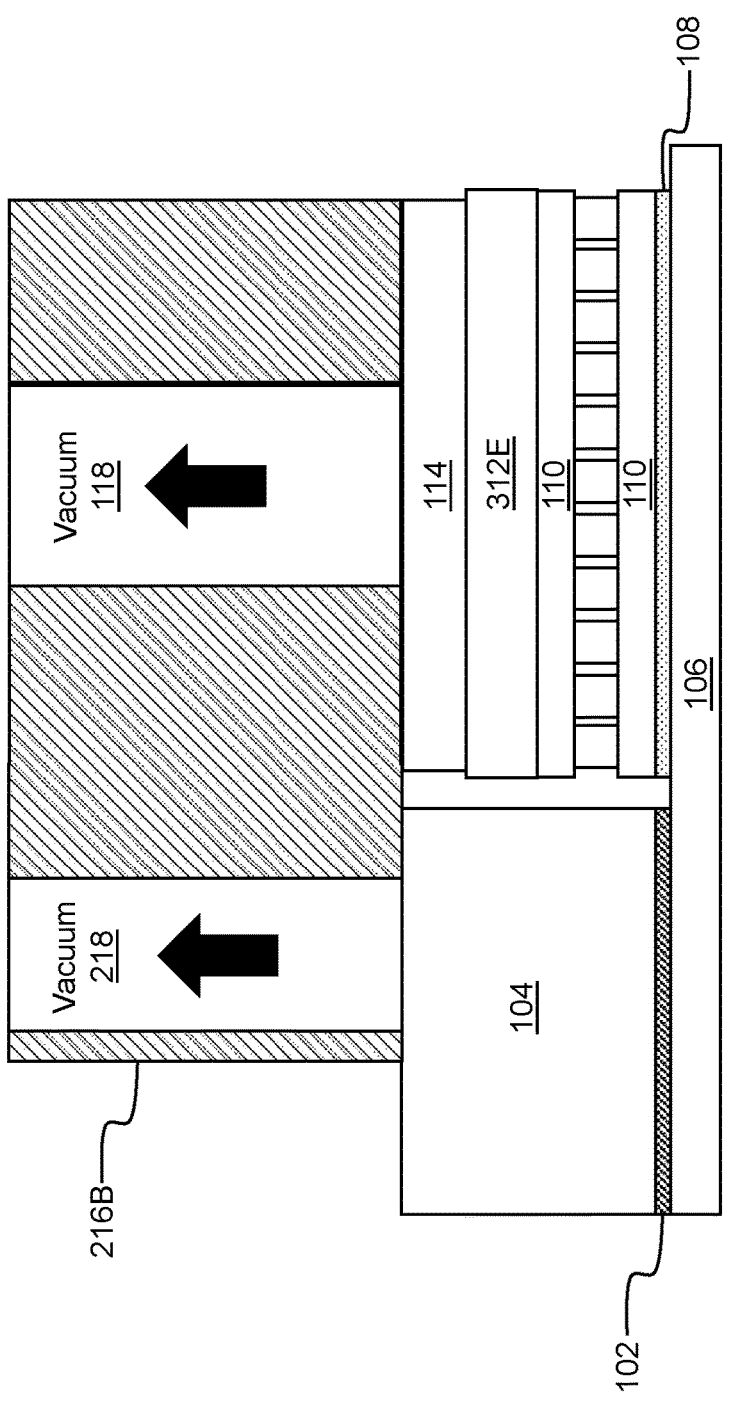

FIG. 3E shows a schematic diagram of an example assembly process for a device 300E. A pick-up tool 216B carrying a chip 114 has traversed downwards to place the chip 114 on top of a post-chip placement adhesive 312E. The pick-up tool 216B senses contact between a bottom surface of the pick-up tool 216B and a top surface of a reference package 104 by measuring a change in pressure within a vacuum detection channel 218. After sensing contact, the pick-up tool 216B releases the chip (e.g., by increasing the pressure within a vacuum channel 118).

Figure 3F:
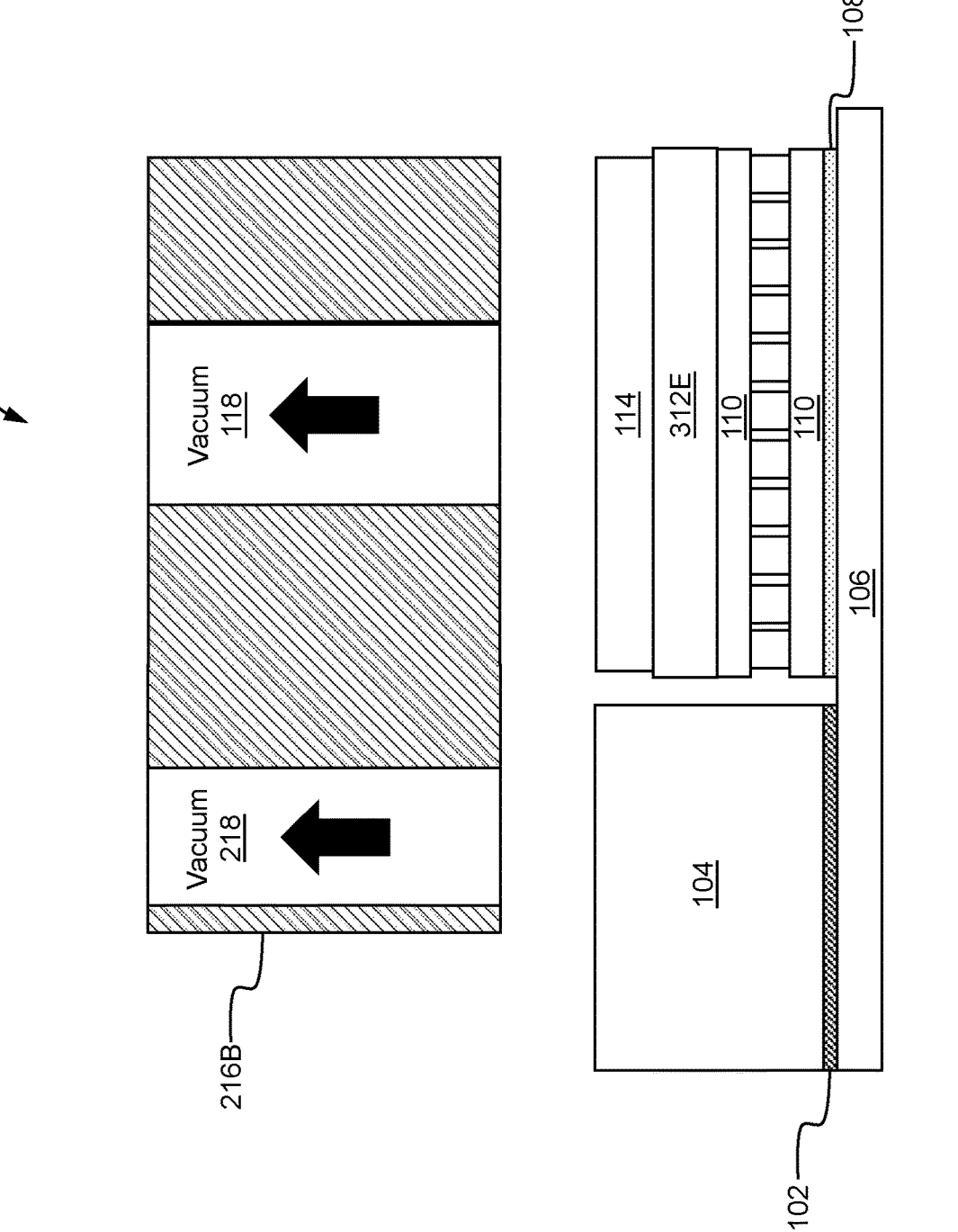

FIG. 3F shows a schematic diagram of an example assembly process for a device 300F. A pick-up tool 216B carrying a chip 114 has traversed upwards after placing the chip 114 on top of a post-chip placement adhesive 312E. The pick-up tool 216B can then be used for additional steps in the assembly process, if desired. In this example, a top surface of the chip 114 is in the same vertical plane as a top surface of a reference package 104.

FIGS. 4A-D show an example assembly process for assembling an example device.

Figure 4A:
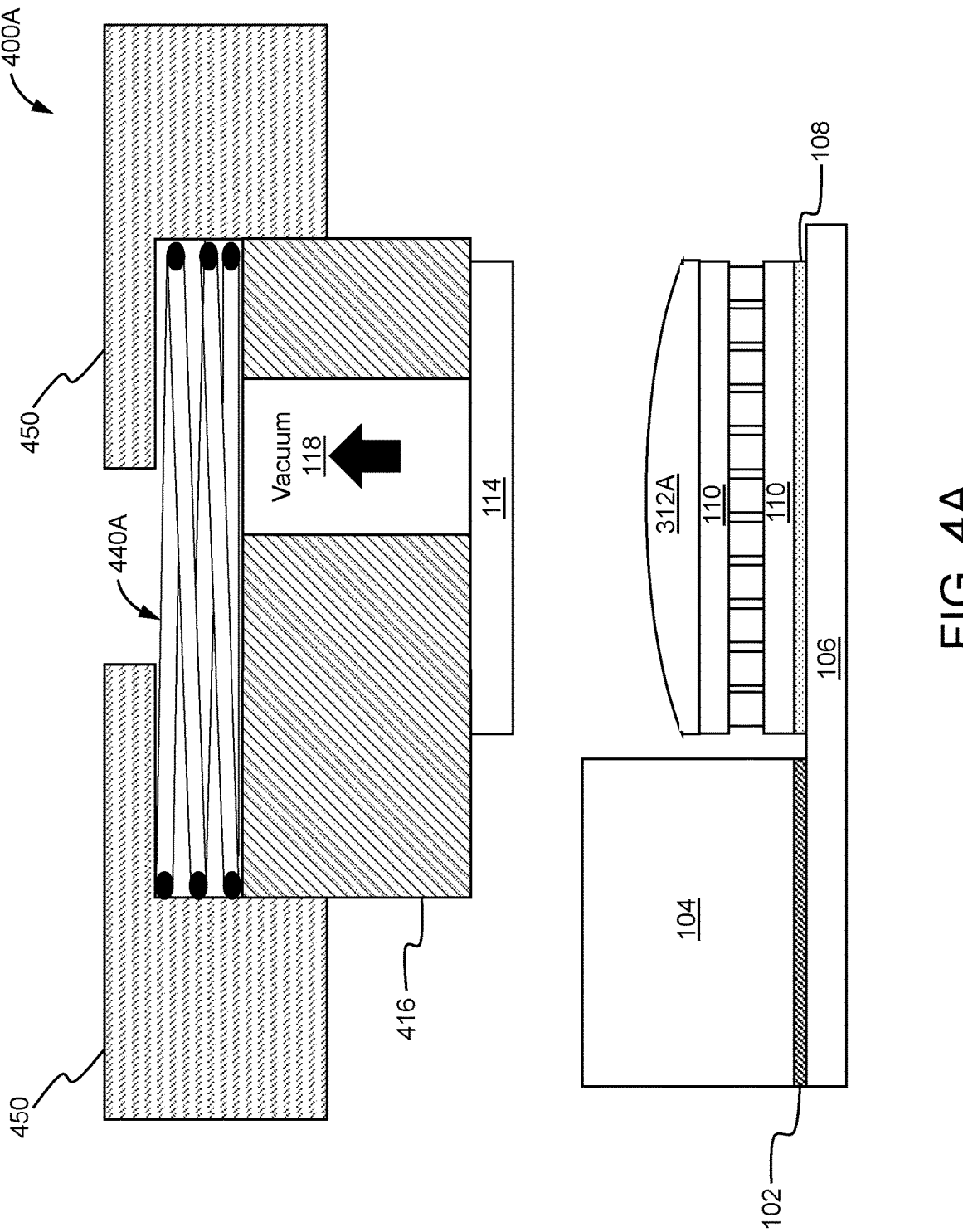
FIGS. 4A, 4B, 4C, and 4D are schematic diagrams of an example assembly process for a device.

FIG. 4A shows a schematic diagram of an example arrangement at an assembly step 400A. A pick-up tool 416 comprises an uncompressed compressible tool component 440A and a holder 450. In some examples, the holder 450 may be part of or attached to a larger assembly that can be spatially translated. In such examples, the pick-up tool 416 may be a sub-component of the larger assembly. The pick-up tool 416 lifts and holds a chip 114 using negative pressure provided by a vacuum channel 118. The pick-up tool 416 can be spatially translated such that the chip 114 is vertically above a pre-chip placement adhesive 312A.

Figure 4B:
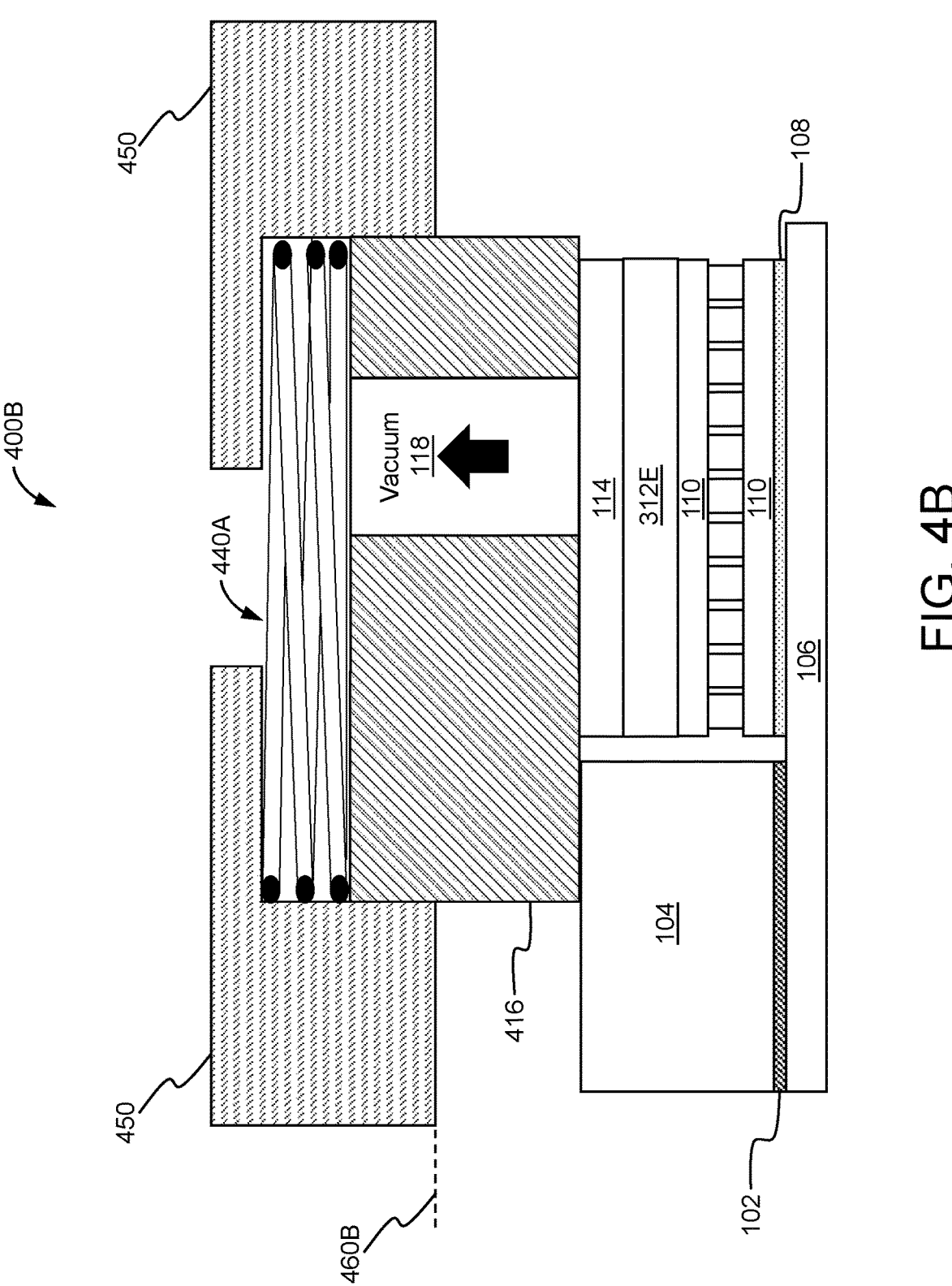

FIG. 4B shows a schematic diagram of an example arrangement at an assembly step 400B. A pick-up tool 416 carrying a chip 114 has traversed downwards and contact between a bottom surface of the pick-up tool 416 and a top surface of a reference package 104 has occurred. A bottom surface of a holder 450 is at a first vertical height 460B.

Figure 4C:
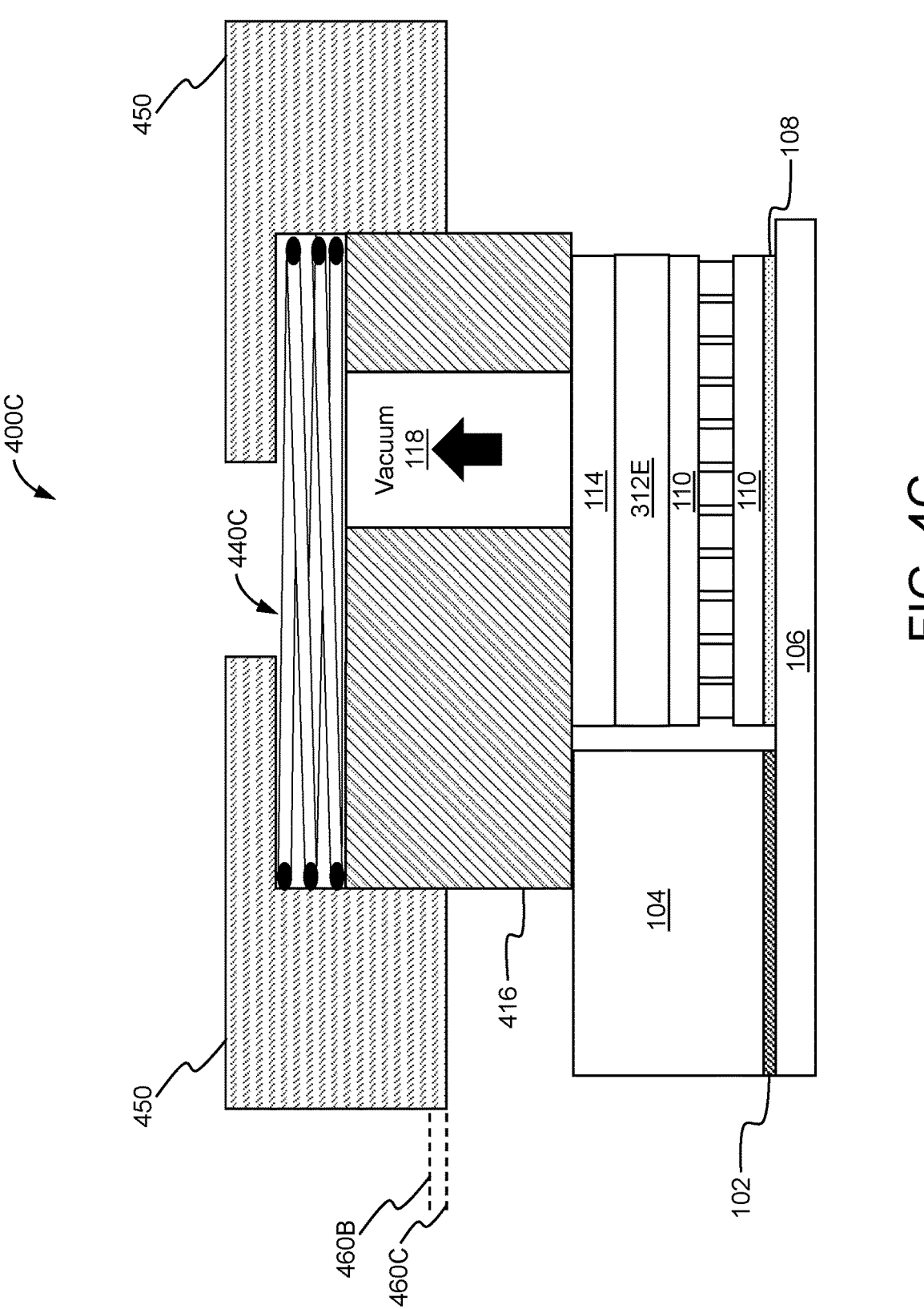

FIG. 4C shows a schematic diagram of an example arrangement at an assembly step 400C. As a pick-up tool 416 is lowered further, a compressed compressible tool component 440C will compress while a bottom surface of the pick-up tool 416 remains immobile due to normal force from a reference package 104. As the compressed compressible tool component 440C compresses, a holder 450 will travel downwards by an amount equal to a compression distance, such that a bottom surface of the holder 450 is at a second vertical height 460C. Therefore, the compressed compressible tool component 440C has compressed relative to the uncompressed compressible tool component 440A of FIGS. 4A-B by an amount equal to a distance between the second vertical height 460C and a first vertical height 460B. For example, the pick-up tool 416 may begin spatially translating (e.g., from a position represented in FIG. 4B) and end the spatially translating (e.g., from a position represented in FIG. 4C) when a sum of (1) a distance traveled by a chip 114 during the spatially translating and (2) the compression distance is substantially equal to a determined travel distance. The determined travel distance may be determined, for example, by estimating the vertical distance of a top surface of the chip 114 from a top surface of a reference package 104, and then adding to that distance a second distance that accounts for uncertainties (e.g., a tolerance) in the estimated vertical distance. After spatially translating the pick-up tool 416 by the determined travel distance, the pick-up tool 416 releases the chip 114 (e.g., by increasing the pressure within a vacuum channel 118). Thus, the pick-up tool 416 tool allows for inaccuracies in exact location to be compensated for by compressing the compressed compressible tool component 440C rather than continuing movement of the chip 114.

As described above, in one aspect, in general, a method for placing a chip for device manufacturing comprises: picking up the chip with a component placement tool comprising a tool surface; spatially translating the component placement tool and the chip along a direction substantially perpendicular to a plane defined by a reference surface, the spatially translating comprising beginning the spatially translating at a first spatial coordinate with respect to the direction, and ending the spatially translating when contact between the reference surface and the tool surface is detected by a sensor at a second spatial coordinate with respect to the direction; and in response to detecting the contact, releasing the chip from the component placement tool and onto a portion of a device assembly in proximity to the second spatial coordinate with respect to the direction.

Aspects can include one or more of the following features.

The portion of the device assembly onto which the chip is released comprises adhesive.

The adhesive is thermally conductive and located on top of a temperature control module.

The adhesive has a non-uniform thickness.

The spatially translating further comprises spatially translating the component placement tool along a direction substantially parallel to the plane defined by the reference surface.

The sensor detects contact between the reference surface and the tool surface by at least one of (1) detecting a change in mechanical force, (2) detecting a change in air pressure in a portion of the component placement tool, or (3) detecting a change in an electrical connection caused by the contact between the reference surface and the tool surface.

In another aspect, in general, a component placement tool for placing a chip for device manufacturing, the component placement tool comprising: a movable portion comprising a component manipulation portion configured to pick up the chip and to release the chip, and a detection portion configured to detect contact between a tool surface and a reference surface; and a control module configured to spatially translate the movable portion along a direction substantially perpendicular to a plane defined by the reference surface, the spatially translating comprising beginning the spatially translating at a first spatial coordinate with respect to the direction, and ending the spatially translating when contact between the tool surface and the reference surface is detected by the detection portion at a second spatial coordinate with respect to the direction; and release the chip from the component manipulation portion and onto a portion of a device assembly in proximity to the second spatial coordinate with respect to the direction, in response to detecting the contact.

Aspects can include one or more of the following features.

The chip comprises a plurality of electrical or optical connections.

The component manipulation portion and the detection portion define respective planes that are substantially the same.

The component manipulation portion and the detection portion define respective planes that are offset from one another along the direction substantially perpendicular to the plane defined by the reference surface.

The component manipulation portion configured to pick up the chip and to release the chip comprises at least one of (1) a negative pressure portion configured to secure the chip using suction, or (2) a gripping portion configured to secure the chip using mechanical contact.

The reference surface is rigid.

In another aspect, in general, a method for placing a chip for device manufacturing comprises: determining a first spatial coordinate with respect to a direction substantially perpendicular to a plane defined by a reference surface; determining a tolerance range of the first spatial coordinate; determining a second spatial coordinate with respect to the direction, based at least in part on the first spatial coordinate and the tolerance range; determining a travel distance between the second spatial coordinate and a third spatial coordinate with respect to the direction; picking up the chip with a component placement tool comprises a tool surface and a compressible tool component; spatially translating the component placement tool along the direction, the spatially translating comprising beginning the spatially translating at the third spatial coordinate; spatially translating the chip to a spatial coordinate at which the tool surface contacts the reference surface; pressing the tool surface against the reference surface, thereby compressing the compressible tool component by a compression distance without further spatial translation of the chip; and ending the spatially translating of the component placement tool when a sum of a distance traveled by the chip during the spatially translating and the compression distance is substantially equal to the determined travel distance; releasing the chip from the component placement tool and onto a portion of a device assembly in proximity to the first spatial coordinate with respect to the direction.

Aspects can include one or more of the following features.

The compressible tool component comprises one or more springs.

The compression distance is greater than 5 microns and less than 500 microns.

The method further comprises picking up a second chip with the component placement tool, prior to spatially translating the component placement tool.

The reference surface is a top surface of a second chip.

The method further comprises forming electrical and/or optical connections between the second chip and the chip.

The connections include at least one free-space optical connection.

The connections include at least one electrical connection that is formed by wire bonding and transmits signals that include radio frequencies.

Figure 4D:
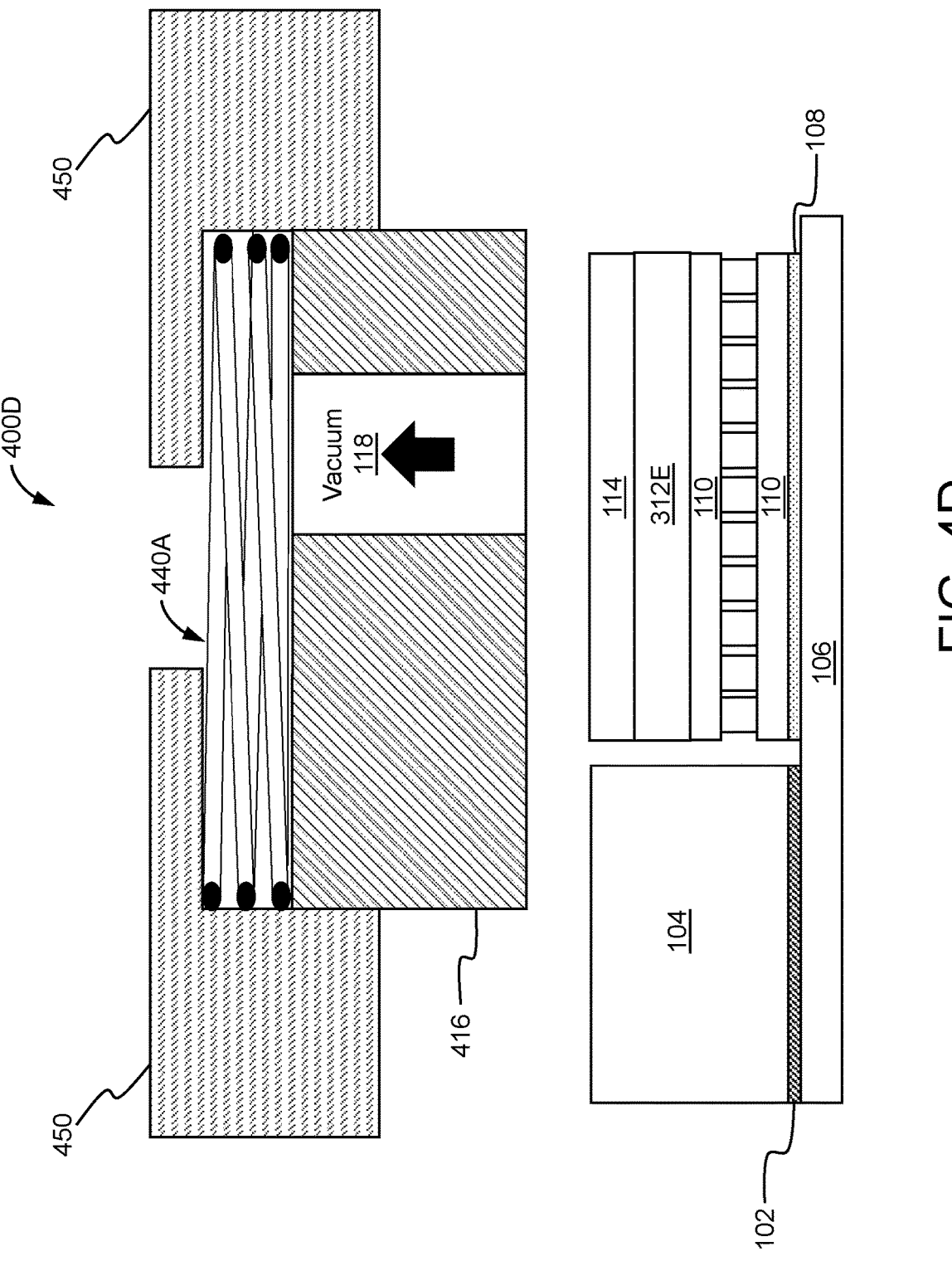

FIG. 4D shows a schematic diagram of an example arrangement at an assembly step 400D. A pick-up tool 416 carrying a chip 114 has traversed upwards after placing the chip 114 on top of a post-chip placement adhesive 312E. The pick-up tool 416 can then be used for additional steps in the assembly process, if desired. In this example, a top surface of the chip 114 is in the same vertical plane as a top surface of a reference package 104.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A method for placing a chip for device manufacturing, the method comprising:
   picking up the chip with a component placement tool comprising a tool surface;
   spatially translating the component placement tool and the chip along a direction substantially perpendicular to a plane defined by a reference surface, the spatially translating comprising
   beginning the spatially translating at a first spatial coordinate with respect to the direction, and
   ending the spatially translating when contact between the reference surface and the tool surface is detected by a sensor at a second spatial coordinate with respect to the direction; and
   in response to detecting the contact, releasing the chip from the component placement tool and onto a portion of a device assembly in proximity to the second spatial coordinate with respect to the direction;
   wherein the portion of the device assembly onto which the chip is released comprises adhesive.

2. The method of claim 1, wherein the adhesive is thermally conductive and located on top of a temperature control module.

3. The method of claim 1, wherein the adhesive has a non-uniform thickness.

4. The method of claim 1, wherein the spatially translating further comprises spatially translating the component placement tool along a direction substantially parallel to the plane defined by the reference surface.

5. The method of claim 1, wherein the sensor detects contact between the reference surface and the tool surface by at least one of (1) detecting a change in mechanical force, (2) detecting a change in air pressure in a portion of the component placement tool, or (3) detecting a change in an electrical connection caused by the contact between the reference surface and the tool surface.

6. The method of claim 5, wherein the sensor detects contact between the reference surface and the tool surface by at least one of detecting a change in mechanical force, or detecting a change in air pressure in a portion of the component placement tool.

7. The method of claim 5, wherein the sensor detects contact between the reference surface and the tool surface by at least one of detecting a change in mechanical force, or detecting a change in an electrical connection caused by the contact between the reference surface and the tool surface.

8. The method of claim 5, wherein the sensor detects contact between the reference surface and the tool surface by at least one of detecting a change in air pressure in a portion of the component placement tool, or detecting a change in an electrical connection caused by the contact between the reference surface and the tool surface.

9. The method of claim 5, wherein the sensor detects contact between the reference surface and the tool surface by detecting a change in air pressure in a portion of the component placement tool.

10. The method of claim 1, wherein the chip comprises a plurality of electrical or optical connections.

11. The method of claim 1, wherein the component placement tool comprises a component manipulation portion and a detection portion that define respective planes that are substantially the same.

12. The method of claim 1, wherein the component placement tool comprises a component manipulation portion and a detection portion that define respective planes that are offset from one another along the direction substantially perpendicular to the plane defined by the reference surface.

13. The method of claim 1, wherein the component placement tool comprises a component manipulation portion configured to pick up the chip and to release the chip, and the component manipulation portion comprises at least one of (1) a negative pressure portion configured to secure the chip using suction, or (2) a gripping portion configured to secure the chip using mechanical contact.

14. The method of claim 1, wherein the reference surface is rigid.

15. The method of claim 1, wherein the component placement tool comprises a component manipulation portion configured to pick up the chip and to release the chip.

16. The method of claim 1, wherein the component placement tool comprises a detection portion that comprises the sensor.

17. The method of claim 1, wherein spatially translating the component placement tool comprises spatially translating the component placement tool over a travel distance that is estimated before the spatially translating begins.

18. A method for placing a chip for device manufacturing, the method comprising:

picking up the chip with a component placement tool comprising a tool surface;

spatially translating the component placement tool and the chip along a direction substantially perpendicular to a plane defined by a reference surface, the spatially translating comprising beginning the spatially translating at a first spatial coordinate with respect to the direction, and ending the spatially translating when contact between the reference surface and the tool surface is detected by a sensor at a second spatial coordinate with respect to the direction; and in response to detecting the contact, releasing the chip from the component placement tool and onto a portion of a device assembly in proximity to the second spatial coordinate with respect to the direction;

wherein the sensor detects contact between the reference surface and the tool surface by at least one of (1) detecting a change in mechanical force, (2) detecting a change in air pressure in a portion of the component placement tool, or (3) detecting a change in an electrical connection caused by the contact between the reference surface and the tool surface; and wherein the sensor detects contact between the reference surface and the tool surface by detecting a change in mechanical force.

19. A method for placing a chip for device manufacturing, the method comprising:

picking up the chip with a component placement tool comprising a tool surface;

spatially translating the component placement tool and the chip along a direction substantially perpendicular to a plane defined by a reference surface, the spatially translating comprising beginning the spatially translating at a first spatial coordinate with respect to the direction, and ending the spatially translating when contact between the reference surface and the tool surface is detected by a sensor at a second spatial coordinate with respect to the direction; and in response to detecting the contact, releasing the chip from the component placement tool and onto a portion of a device assembly in proximity to the second spatial coordinate with respect to the direction;

wherein the sensor detects contact between the reference surface and the tool surface by at least one of (1) detecting a change in mechanical force, (2) detecting a change in air pressure in a portion of the component placement tool, or (3) detecting a change in an electrical connection caused by the contact between the reference surface and the tool surface; and wherein the sensor detects contact between the reference surface and the tool surface by detecting a change in an electrical connection caused by the contact between the reference surface and the tool surface.

* * * * *